(12) United States Patent
Hoppe et al.

(10) Patent No.: US 11,518,280 B2
(45) Date of Patent: Dec. 6, 2022

(54) THERMOELECTRIC FABRIC

(71) Applicant: Mahle International GmbH, Stuttgart (DE)

(72) Inventors: Stefan Hoppe, Dorsten (DE); Andreas Kemle, Tamm (DE); Jan Schoener, Dorsten (DE)

(73) Assignee: Mahle International GmbH

( * ) Notice: Subject to any disclaimer, the term of this patent is extended or adjusted under 35 U.S.C. 154(b) by 680 days.

(21) Appl. No.: 16/521,579

(22) Filed: Jul. 24, 2019

(65) Prior Publication Data

US 2020/0031259 A1 Jan. 30, 2020

(51) Int. Cl.
*H01L 35/30* (2006.01)
*D03D 15/00* (2021.01)
*H01L 35/34* (2006.01)
*B60N 2/56* (2006.01)
*D03D 1/00* (2006.01)
*H01L 35/16* (2006.01)
*H01L 35/32* (2006.01)

(52) U.S. Cl.
CPC ......... *B60N 2/5685* (2013.01); *D03D 1/0088* (2013.01); *H01L 35/16* (2013.01); *H01L 35/30* (2013.01); *H01L 35/32* (2013.01); *D10B 2401/04* (2013.01); *D10B 2401/16* (2013.01); *D10B 2401/18* (2013.01)

(58) Field of Classification Search
CPC ........ H01L 35/32; H01L 35/34; D03D 1/0088
See application file for complete search history.

(56) References Cited

U.S. PATENT DOCUMENTS

| | | | | | |
|---|---|---|---|---|---|
| 2,768,424 | A | * | 10/1956 | Andrus | H01L 35/34 136/212 |
| 3,019,278 | A | * | 1/1962 | Fischer | H01L 35/32 136/212 |
| 5,007,478 | A | * | 4/1991 | Sengupta | F28D 20/023 165/104.19 |
| 7,205,472 | B2 | * | 4/2007 | Serras | G01K 7/02 374/E7.004 |

(Continued)

FOREIGN PATENT DOCUMENTS

DE 10 2015 217 754 A1 3/2017
DE 10 2017 124 504 A1 4/2018

(Continued)

OTHER PUBLICATIONS

English abstract for JP-JPH10-9969.

*Primary Examiner* — Shin H Kim
(74) *Attorney, Agent, or Firm* — Fishman Stewart PLLC

(57) ABSTRACT

A thermoelectric fabric may include a plurality of first threads and second threads. The first threads may be alternately formed by p-doped and n-doped thread portions and electrically conductive first thread portions and second thread portions arranged in between. The first thread portions may form a hot side of the fabric, and the second thread portions may form a cold side. The first threads may form one of warp threads or weft threads of the fabric, and the second threads may form the other of the warp threads or weft threads. On at least one of the first thread portions of at least one of the plurality of first threads, a temperature control structure with at least one temperature control element for cooling the hot side may be present.

20 Claims, 4 Drawing Sheets

(56) References Cited

U.S. PATENT DOCUMENTS

| | | | | |
|---|---|---|---|---|
| 8,378,206 | B2* | 2/2013 | Schuette | H01L 35/32 |
| | | | | 136/205 |
| 10,461,237 | B2* | 10/2019 | Gruenwald | H01L 35/08 |
| 10,720,560 | B2* | 7/2020 | Grayson | H01L 35/18 |
| 2004/0025930 | A1* | 2/2004 | Serras | G01K 7/02 |
| | | | | 136/200 |
| 2005/0115600 | A1* | 6/2005 | DeSteese | H01L 35/34 |
| | | | | 136/211 |
| 2008/0023056 | A1* | 1/2008 | Kambe | H01L 35/32 |
| | | | | 136/201 |
| 2010/0163283 | A1* | 7/2010 | Hamedi | D03D 15/258 |
| | | | | 174/254 |
| 2012/0060885 | A1* | 3/2012 | Makansi | F25B 21/04 |
| | | | | 29/610.1 |
| 2012/0198616 | A1* | 8/2012 | Makansi | H01C 13/02 |
| | | | | 136/200 |
| 2012/0227778 | A1* | 9/2012 | Leonov | H01L 35/32 |
| | | | | 136/200 |
| 2015/0311421 | A1 | 10/2015 | Jur et al. | |
| 2016/0079509 | A1* | 3/2016 | Grayson | H01L 35/34 |
| | | | | 438/54 |
| 2016/0369436 | A1* | 12/2016 | Stewart | F16J 15/065 |
| 2018/0111527 | A1 | 4/2018 | Tait et al. | |
| 2018/0254402 | A1* | 9/2018 | Gruenwald | H01L 35/08 |

FOREIGN PATENT DOCUMENTS

| | | |
|---|---|---|
| JP | H10-9969 A | 1/1998 |
| WO | WO-2012037031 A1 | 3/2012 |
| WO | WO-2015182923 A1 | 12/2015 |

\* cited by examiner

THERMOELECTRIC FABRIC

CROSS-REFERENCE TO RELATED APPLICATION

This application claims priority to German Patent Application No. DE 10 2018 212 417.5, filed Jul. 25, 2018, which is hereby incorporated in its entirety.

TECHNICAL FIELD

The invention relates to a thermoelectric fabric which can be employed for temperature-controlling various components of a motor vehicle. The fabric is suitable in particular for temperature-controlling a vehicle seat of a motor vehicle.

Furthermore, a thermoelectric device having such a thermoelectric fabric is covered. The invention additionally relates to a vehicle seat having such a thermoelectric device and to a motor vehicle having at least one such thermoelectric seat.

BACKGROUND

Thermoelectric elements of a thermoelectric device consist of thermoelectrically active semiconductor materials which convert a temperature difference into a potential difference, i.e. into an electric voltage and vice versa. In this way, a heat flow can be converted into an electric current and vice versa. The thermoelectric elements are based on the Peltier effect when they convert electric energy into heat and on the Seebeck effect when they convert heat into electric energy. Within a thermoelectric module, p-doped and n-doped thermoelectric elements are interconnected. Frequently, multiple such thermoelectric elements are connected to form a thermoelectric generator which can generate an electric current from a temperature difference in connection with a corresponding heat flow. When an electric voltage is applied to the said thermoelectric modules, so that an electric current flows through these, the elements can be used as so-called Peltier elements for cooling or heating.

Alternatively to this, such thermoelectric devices can be employed in internal combustion engines, in particular motor vehicles, for waste heat recovery, for example in order to convert waste heat contained in the exhaust gas into electric energy. Apart from this, other components of the motor vehicle, for example battery systems can be temperature-controlled, i.e. cooled or heated.

From DE 10 2015 217 754 A1 a thermoelectric device is known with which the surfaces in a motor vehicle, in particular surfaces of a motor vehicle seat in a motor vehicle can be cooled in order to rapidly cool the seat surface for increased sitting comfort for example in the event of intense solar radiation. The device is designed as a fabric and comprises a first plurality of threads, which function for example as warp threads of the fabric and which are equipped with p-doped and n-doped thread portions. When an electric current is conducted through this first plurality of threads, a cooling occurs on the metal semiconductor transitions because of the Peltier effect, and the motor vehicle seat or its sitting surface is cooled. Here, undoped conductor track portions, for example in the form of copper wires or aluminium wires are arranged between the p and n-doped thread portions. Furthermore, a second plurality of electrically insulating threads is provided, which serve for example as weft threads of the fabric. Here, the thermoelectric device or the fabric is designed and arranged in such a manner that the surface in the motor vehicle, in particular of the motor vehicle seat, is cooled.

From DE 10 2017 124 504 A1 a vehicle seat is known, in which an air duct is integrated, through which a cooling medium—typically air—can flow. Through the top of the air duct, a cooling body is introduced into the duct interior which is thermally connected to a hot side of a thermoelectric fabric and can thus if off the heat developing on the hot side to the cooling medium conducted through the cooling duct.

Here it often proves to be difficult to connect the thermoelectric fabric with the air conducted through the air duct in a thermally efficient manner and at the same time arrange the same on the cooling duct in a mechanically stable manner. However, this is absolutely necessary in particular when used in a vehicle seat. For a highly effective technical coupling of the fabric to the cooling medium, the cooling duct would basically have to be designed open so that it is closed by the thermoelectric fabric—for example in the manner of a lid. However, a thermoelectric fabric usually does not have the required mechanical strength or stiffness in order to permanently close the cooling duct, following the function of a lid, even under the effect of an external force in a mechanically stable manner. There is in particular the risk that the flexible, i.e. non-stiff thermoelectric fabric could fall into the interior of the open-design air duct. Conversely it could also be possible that the air conducted through the air duct could enter the thermoelectric fabric which would result in thermal short circuits and thus to a reduced efficiency of the thermoelectric fabric.

SUMMARY

It is therefore an object of the present invention to create an improved embodiment of a thermoelectric fabric with which the disadvantages explained above are at least partly, ideally even completely eliminated.

This object is solved through the subject of the independent patent claims. Advantageous embodiments are subject of the dependent claims.

Accordingly, the basic idea of the invention is to provide a temperature control structure with multiple control elements on the warp or weft threads of a thermoelectric fabric forming a hot side which is thus thermally connected to the hot side of the thermoelectric fabric. The said temperature control elements of the temperature control structure serve for the heat transfer from the hot side of the thermoelectric fabric to a coolant path or cooling duct. The temperature control structure thus is a structure for the heat transfer. The heat transported from the thermoelectric fabric—in the sense of a heat pump—from the cold side to the hot side can be effectively discharged from the latter in an effective manner, which significantly improves the efficiency of the thermoelectric fabric functioning as a heat pump. Preferably, the temperature control elements are cooling elements and the temperature control structure is a cooling structure.

With the solution introduced here it is no longer necessary for establishing a thermal contact between cooling medium and thermoelectric fabric to arrange the hot side of the same directly in the coolant path or cooling duct and—as explained above—close off the same. On the contrary, with the solution according to the invention introduced here it is possible with suitable geometrical configuration of the temperature control elements—for example with a pin or needle-type (or blade-shaped) geometry—to pass the same through a duct wall limiting the coolant path or cooling duct and in this way establish the desired thermal connection with the cooling medium conducted through the coolant path or coolant duct. When using the thermoelectric fabric according to the invention it is not necessary to design the coolant path or cooling duct open in order to achieve the desired thermal coupling of the thermoelectric fabric to the medium flowing through the coolant path. On the contrary it is possible to arrange the thermoelectric fabric outside on a duct wall limiting the cooling duct, so that the desired mechanical stability of the coolant path or cooling duct remains ensured through the duct wall of the cooling duct. When the temperature control elements are conducted through the cooling duct wall into the duct interior, for example in that for each temperature control element an opening is provided in the duct wall, the temperature control elements project into the duct interior where they can thermally interact with the coolant. In this way, heat transported to the hot side can be very effectively discharged from the fabric during the operation of the thermoelectric fabric—i.e. when the same is electrically energised. The thermoelectric fabric or a thermoelectric device having such a fabric according to the invention is therefore suitable in particular for use in a vehicle seat, in which an air duct through which a cooling medium such as for example air can flow is provided.

The p or n-doped thread sections are formed by a semiconductor material in a manner known per se, i.e. in particular bismuth tellurite or antimony tellurite, which is doped in a suitable manner in order to have the desired electrical semiconductor properties. These doped thread portions are now connected to wide, flexible, preferentially stretchable conductor track portions. Through the arrangement of the p and n-doped thread portions, the said hot and cold side are created when the fabric is electrically energised. With the correct installation position of the fabric in a vehicle seat of a motor vehicle, a surface of the seat can thus be cooled for example in that heat that is present on the surface of the vehicle seat is passed on via the cold side of the fabric to the hot side of the fabric and from there, via the temperature control structure with the temperature control elements, given off to a cooling duct arranged underneath the fabric and through which a cooling medium such as for example air can flow.

A thermoelectric fabric according to the invention, in particular for a vehicle seat of a motor vehicle, comprises a plurality of first threads, which are alternately formed by p-doped and n-doped thread portions as well as first and second thread portions arranged in between. The first and second thread portions and thus the first threads as an entirety are designed electrically conductive so that they can be electrically energised. The fabric is designed or arranged in such a manner that upon electrical energization of the threads, the first thread portions of the same form a hot side and the second thread portions of the same form a cold side of the fabric. Here, the hot side and the cold side are exclusively determined via the transport direction of that heat which is transported from the thermoelectric fabric during the operation, i.e. on applying an electric voltage for generating the Peltier effect: by definition, this heat is transported from the cold side to the hot side. This definition applies also in the case that hot side and the cold side are coupled to heat reservoirs of different temperature, as can be the case in particular when applying the fabric according to the invention in a vehicle seat. In this case, operating states can also occur during which the hot side of the thermoelectric fabric in accordance with the above definition—at least temporarily—has a lower temperature than the cold side.

Furthermore, the thermoelectric fabric comprises a plurality of second threads which can be preferentially designed so as to be electrically insulating in order to avoid undesirable electrical short circuits with the electrically conductive first threads. According to the invention, a temperature control structure with at least one temperature control element is arranged on at least one first thread portion of at least one first thread forming the hot side.

It is to be understood that the thermoelectric fabric can be equipped with electrical input and output lines, a fuse to prevent overvoltage and possibly a temperature sensor for the automatic deactivation when a limit temperature is exceeded or undershot.

According to a preferred embodiment, preferentially multiple first threads, most preferentially all first threads, at least two temperature control elements, preferentially between three and twenty temperature control elements are arranged on at least one first thread portion, preferentially on multiple first thread portions, most preferentially on all first thread portions of the at least one first thread. In this way, the thermal connection of the hot side of the fabric created by means of the temperature control structure can be increased.

Preferably, at least one temperature control element is designed pin-like or needle-like or blade-like. Particularly preferably, this applies to all temperature control elements. A pin-like or needle-like or blade-like design of the temperature control elements allows arranging a multiplicity of such temperature control elements on relatively little installation space. Apart from this, temperature control elements with pin or needle-like or blade-like geometry are suitable for being made to pierce through a duct wall of a cooling duct. For this purpose, a respective opening can be provided on the said duct wall for example for every pin or needle-like or blade-like temperature control element. Here it is conceivable in particular that these openings are produced by "piercing through" the duct wall using the pin or needle-like or blade-like temperature control elements, when the thermoelectric fabric is applied to an outside of the duct wall of the duct.

According to an advantageous further development, a needle or pin diameter of a temperature control element designed needle or pin-like amounts to between 0.5 mm and 3 mm. Alternatively or additionally, a needle or pin length of at least one temperature control element designed needle or pin-like with this further development amounts to between 5 mm and 50 mm; alternatively or additionally to this, at least one temperature control element designed needle or pin-like comprises an end portion facing away from the first thread portion of the respective first thread which is preferably injection moulded on and alternatively or additionally tapers away from the first thread portion preferentially conically.

According to an advantageous further development, at least one temperature control element is connected in a firmly bonded manner to the respective first thread section preferentially by means of a soldered connection or by means of a welded connection—practically produced by means of ultrasound welding or by means of resistance welding. Such a firmly bonded connection brings about a particularly efficient thermal coupling of the said first thread portion to the respective temperature control element. This version is particularly appropriate when the material of the temperature control element is an electrically conductive material, preferentially a metal. Alternatively or additionally, a positive connection of the temperature control element concerned with the first thread portion is also possible; by means of a positive-locking connection, a mechanically particularly stable fixing of the temperature control element on the respective first thread portion can be achieved. Particularly preferably, all temperature control elements are therefore connected to the respective first thread portion in a firmly bonded or positively locked manner.

According to another preferred embodiment, at least one temperature control element projects the respective first thread portion at an angle, preferentially substantially orthogonally. This applies in particular to all temperature control elements. Such a geometry facilitates piercing the said temperature control elements, in particular when these are formed pin or needle-like or blade-like, through a said duct wall of a cooling duct—subject to forming suitable, fluid-tight openings.

According to a further preferred embodiment, the first or/and second thread portions are formed by areal, flexible, preferentially stretchable conductor track portions. With such an areal design of the conductor track portions, an enlarged area is available between the p and n-doped thread portions for the heat transfer and thus for the cooling or discharging of heat. In particular, a rapid cooling down of an object to be cooled, in particular of a setting surface or/and a backrest of a vehicle seat is possible in this way.

In an advantageous further development of the solution according to the invention, the conductor track portions between the doped thread portions comprise an electrically insulating substrate material, in particular polyurethane (PU) or polyimide (PI), in order to have an adequate mechanical stability despite the presence of flexibility for example for adapting to different shapes. Here, the conductor track portions are substantially completely surrounded by the substrate material.

A further advantageous configuration provides that the said conductor track portions between the doped thread portions consist of copper of aluminium or at least comprise copper or aluminium which has a high electrical and thermal conductivity. Preferably, the conductor track portion can be formed by a copper wire or aluminium wire extending meander-like, which is cast into the substrate material such as polyurethane or polyimide.

A further advantageous configuration of the invention consists in that the conductor track portions are laminated. For this purpose, a conductor track, preferentially made of copper or aluminium, is mounted onto a first layer of the substrate material and then covered with a second layer of the substrate material which is preferentially laminated on.

According to a further preferred embodiment of the invention, the first or/and second thread portions, i.e. the undoped conductor track portions, as well as the p and n-doped thread portions, are soft-soldered to one another. This means that between the various materials or components of the thermoelectric fabric there is a soft-solder connection. As a function of the materials, these soft-solder points consist of a suitable solder and make possible a certain movability of the entire fabric in order to adapt to different surface contours.

According to a preferred embodiment, the first thread portions, in a plan view of an underside of the fabric, cover the said underside substantially completely. With this embodiment, the second thread portions, in a plan view of a top side of the fabric, which is located opposite the underside, alternatively or additionally cover this said top side substantially completely. In this way, the efficiency of the thermoelectric fabric can be further improved. "Substantially" can mean in particular that in the respective plan view merely the doped conductor track portions and intermediate spaces between adjacent warp and weft threads are not covered.

According to an advantageous further development of the invention, the electrically insulating second threads comprise substrate ribs which are formed in particular from a closed-pore silicone foam. Practically, the second threads can consist of such substrate ribs. The substrate ribs can be produced with the desired elasticity and electrical insulation capability in order to be interwoven for example with the first plurality of threads consisting of p and n-doped thread portions and conductor track portions arranged in between to form a fabric. Alternatively, the use of foam rubber or similar plastic materials is also possible for the plurality of second threads, wherein materials are preferred which have a low heat conductivity and yet offer a pleasant surface feel. By way of the low thermal heat conductivity, the hot side and the cold side of the thermoelectric fabric are thermally insulated from one another and the efficiency increased.

According to a further advantageous further development of the invention, the first or/and second thread portions, i.e. the undoped conductor track portions, between the doped thread portions are embodied wider than these. Thus, the effective area for the heat transfer or discharge is increased.

The invention, furthermore, relates to a thermoelectric device for a vehicle seat. The device comprises a coolant path for a coolant, in particular air to flow through. Furthermore, the device comprises a thermoelectric fabric introduced above, the temperature control elements of which project into the coolant path so that they can enter into thermal interaction with the coolant and thus function as cooling elements. The advantages of the thermoelectric fabric explained above therefore apply also to the thermoelectric device according to the invention. Such a thermoelectric device can be employed in particular in a vehicle seat of a motor vehicle, when the surface of the seat body of the vehicle seat is to be cooled. In this case, a particularly effective thermal connection between the coolant path that is likewise integrated in the vehicle seat and the surface or sitting surface of the seat body can be established with the help of the temperature control structure of the thermoelectric device or of the thermoelectric fabric according to the invention.

According to a preferred embodiment of this thermoelectric device, the coolant path comprises a cooling duct with a duct wall, on the outside of which the thermoelectric fabric is arranged. With this embodiment, openings are formed through which the temperature control elements, which in turn are formed preferentially pin-like or needle-like or blade-like, engage.

The invention also relates to a vehicle seat for a motor vehicle. The vehicle seat comprises a seat body or/and a seat rest, in which at least one of the thermoelectric devices explained above is arranged, integrated or received. The advantages of the thermoelectric device explained above therefore apply also to the vehicle seat according to the invention. Here, the fabric, because of the conductor tracks which preferentially extend meander-like and because of the soft-solder points, can adapt to the different shapes of the vehicle seat, which amongst other things are brought about by way of different weights of the vehicle occupants.

According to a preferred embodiment, the thermoelectric device with the thermoelectric fabric and the coolant path is arranged or received in a recess formed in the seat body.

The thermoelectric device according to the invention can also be used elsewhere in the interior of a motor vehicle. For example, the thermoelectric fabric of the device can be installed under a cover layer in an instrument panel or a side paneling or any other surface in the interior of the motor vehicle. The thermoelectric fabric is either activated automatically when a conventional air conditioning system is switched on, through manual actuation or another way and then cools the relevant surface.

In principle, such a thermoelectric fabric can also be employed in other technical fields, in particular in vehicle construction.

Finally, the invention relates to a motor vehicle having at least one such vehicle seat. The advantages of the vehicle seat according to the invention explained above therefore apply also to the motor vehicle.

Further important features and advantages of the invention are obtained from the subclaims, from the drawings and from the associated figure description by way of the drawings.

It is to be understood that the features mentioned above and still to be explained in the following cannot only be used in the respective combination stated but also in other combinations or by themselves without leaving the scope of the present invention.

BRIEF DESCRIPTION OF THE DRAWINGS

Preferred exemplary embodiments of the invention are shown in the drawings and are explained in more detail in the following description, wherein same reference numbers relate to same or similar or functionally same components.

There it shows, in each case schematically

DETAILED DESCRIPTION

Figure 1:
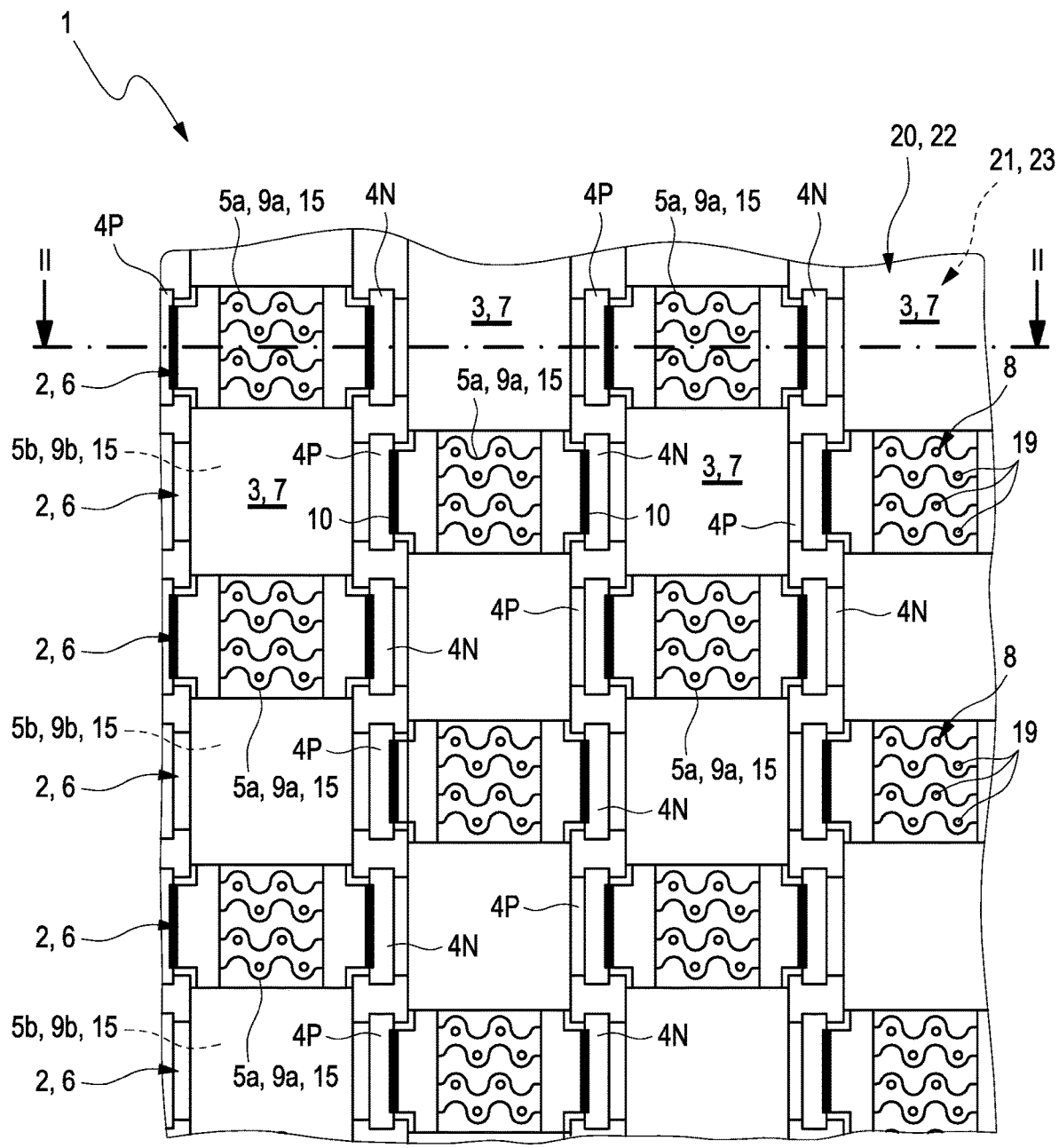
FIG. 1a thermoelectric fabric according to the invention in a plan view of an underside, FIG. 2 the fabric of FIG. 1 in a sectional representation, FIG. 3a rough schematic, perspective representation of the fabric of FIGS. 1 and 2, FIG. 4a further development of the fabric of FIGS. 1 to 3.

FIG. 1 shows an example of a thermoelectric fabric 1 for a vehicle seat of a motor vehicle in a plan view of an underside 22 of the fabric 1 along a viewing direction B1. The fabric 1 comprises electrically conductive first threads 2, which are alternately formed by p-doped and n-doped thread portions 4N, 4P and first and second thread portions 5a, 5b arranged in between, which are formed to be electrically conductive. The first thread portions 5a form a hot side 20 of the fabric 1 on the underside 22 of the fabric 1. The second thread portions 5b form a cold side 21 of the fabric 1 on the top side 23 (not noticeable in the plan view of FIG. 1 onto the underside 22 of the fabric 1).

Aside from this, the fabric 1 comprises electrically insulating second threads 3. In the example of the figures, the first threads 2 form warp threads 6 and the second threads 3 form weft threads 7 of the fabric 1. In a version, an inverted assignment is also possible however. The weft threads 7 can be formed by a closed-cell silicone foam.

Figure 2:
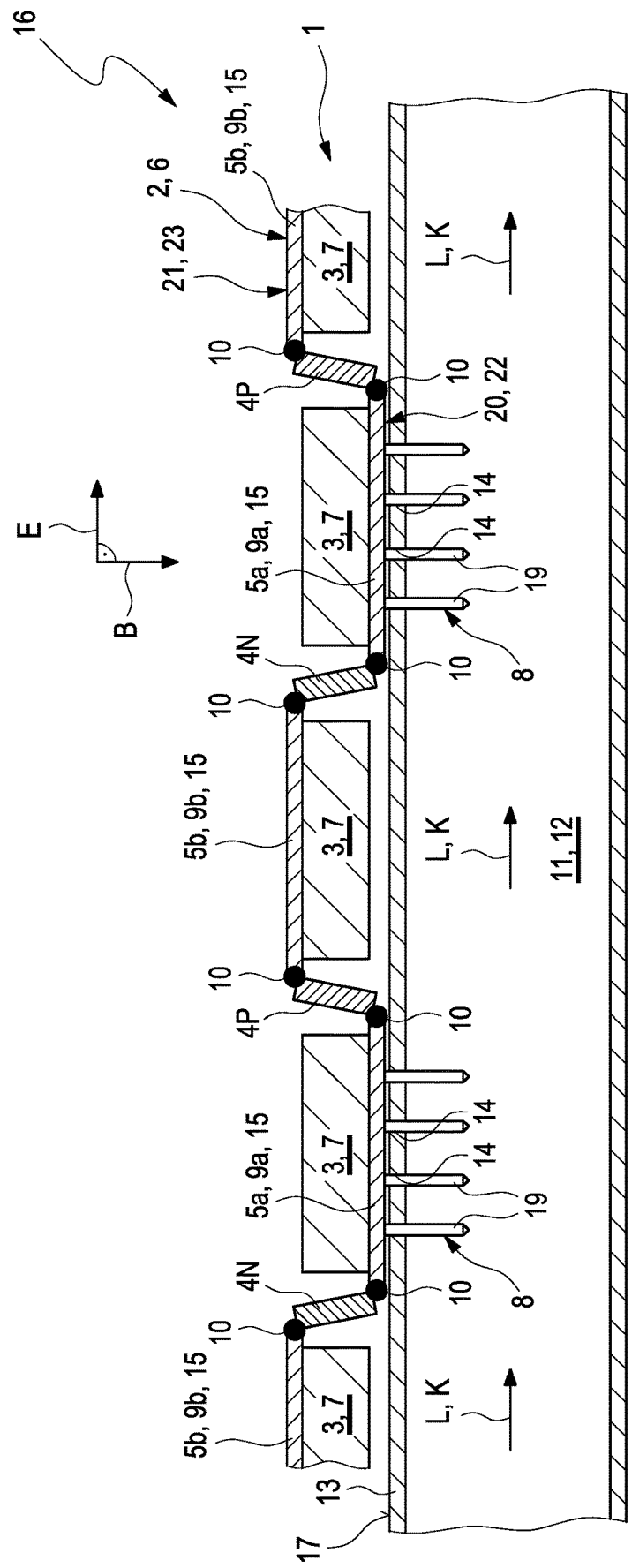

FIG. 2 shows the fabric of FIG. 1 in a cross section along the section line II-II in FIG. 1. According to FIG. 2, the warp thread 6 comprises alternating p and n-doped thread portions 4N, 4P, which alternate along an extension direction E of the warp thread 6. Between the p and n-doped thread portions, a first and second thread portion 5a, 5b each is alternately arranged, which in each case is formed so as to be electrically conductive. Along the extension direction E, an n-doped thread portion 4N is thus followed by a first thread portion 5a, the same by a p-doped thread portion 4P, and the same again by a second thread portion 5b. The first thread portions 5a of the fabric 1 form the hot side 20 of the thermoelectric fabric 1 on the underside. The second thread portions 5b form the cold side 21 of the thermoelectric fabric 1 on the top side (see FIG. 1).

The first and second thread portions 5a, 5b are realised in the form of areal, flexible and stretchable conductor track portions 9a and 9b respectively, which can be formed by copper wires 15 or aluminium wires which are arranged meander-like. Between the thread portions 5a, 5b, a semiconductor element or a doped conductor track portion 4N, which is n-doped, or a semiconductor element of a doped conductor track portion 4P, which is p-doped can be arranged in each case. The n-doped thread portions 4N comprise for example bismuth tellurite and the p-doped thread portions 4P comprise for example antimony tellurite. However, all other materials known to the person skilled in the art are also conceivable. The p-doped and n-doped thread portions 4N, 4P and the electrically conductive thread portions 5a, 5b arranged in between are each connected by means of soft-solder points 10. The first and second thread portions 5a, 5b as part of the first thread 2 or of the warp thread 6 are each alternately interwoven with the second threads 3, i.e. the weft threads 7 or the closed-cell silicone foam in order to form the thermoelectric fabric 1. Because of the meander-like arrangement of the copper wire 15, the first and second thread portions 5a, 5b are thus stretchable and can change for example their longitudinal extension along the extension direction E so as not to be damaged among other things in a seat body of a motor vehicle seat. Thus, a stretch region is formed. Here, the first and second thread portions 5a, 5b and the doped thread portions 4P, 4N are preferentially mounted in a substrate material such as polyurethane or polyimide. The warp threads 6 can be provided with termination ribs (not shown) at both ends in order to make possible an electrical contacting to an external power supply for example from a vehicle electrical system.

As is further evident in the FIGS. 1 and 2, a temperature control structure 8 with a plurality of temperature control elements 19 is provided on the first thread portions 5a forming the hot side 20. The temperature control structure 8 with the temperature control elements 19 serves for cooling the hot side 20. In the example of FIG. 2, four temperature control elements 19 each are exemplarily shown on the two shown first thread portions 5a. Obviously, in versions of this example a different number of temperature control elements 19 is possible. According to FIG. 2, temperature control elements 19 are formed pin or needle-like. The temperature control elements 19 of the temperature control structure 8 can be connected to the respective first thread portion 5a in a firmly bonded manner, i.e. for example by means of a soldered connection. Alternatively or additionally, a positive-locking connection of the temperature control elements 19 to the relevant first thread portion 5a is also possible (not shown). According to FIG. 2, the temperature control elements 19 project orthogonally, i.e. at an angle from the respective first thread portion 5a.

As illustratively proven by FIG. 2, the temperature control elements 19 project into a coolant path 11 in the form of a cooling duct 12, which is partly limited by a duct wall 13 and through which a coolant K can flow. To this end, the fabric 1 is arranged on an outside 17 of the cooling duct 12 or of the duct wall 13.

In the duct wall 13, openings 14 are formed through which the temperature control elements 19, which are preferentially formed pin-like or needle-like or blade-like, engage. Here, an individual opening is provided for each temperature control element 19. Accordingly, the temperature control elements 19 thus project at least partly into the coolant path 11 or into the cooling duct 12.

The coolant path 11 or cooling duct 12 can be flowed through by a coolant K, for example air. By way of the temperature control elements 19 of the temperature control structure 8, heat, which during the operation of the thermoelectric fabric 1, i.e. when an electric voltage is applied to the thermoelectric fabric 1, is transported from the cold side 21 to the hot side 20, can be discharged from the hot side 20. The thermoelectric fabric 1 and the coolant path 11 together form a thermoelectric device 16.

Figure 3:
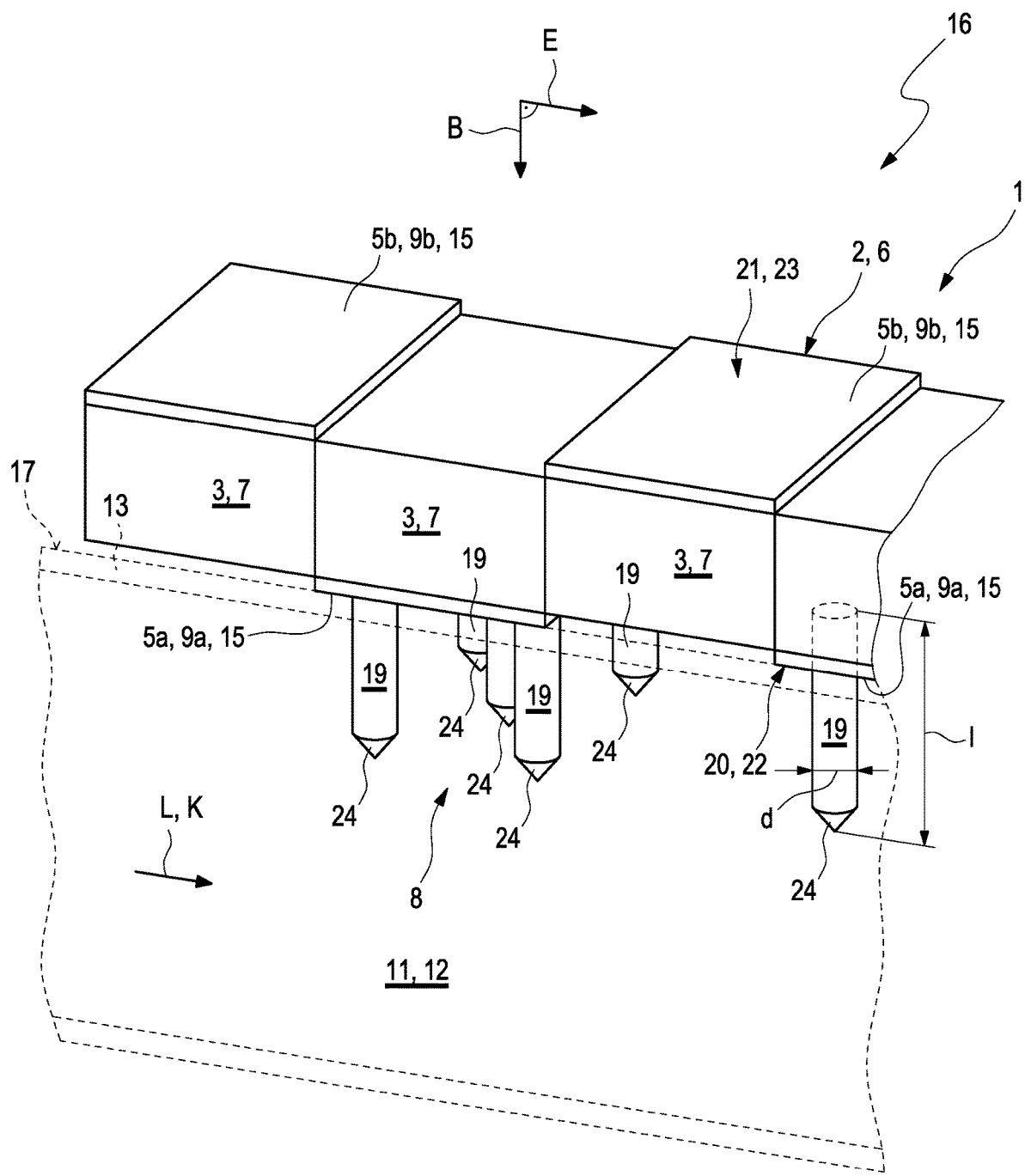

FIG. 3 shows the device 16 of the FIGS. 1 and 2 in an enlarged, greatly simplified and perspective representation. In the FIG. 3, a preferred arrangement and shaping of the temperature control elements 19 are particularly well noticeable. Accordingly, the temperature control elements 19 are arranged spaced from one another. Preferred here is a grid-like or irregular arrangement of the temperature control elements 19 relative to the respective first thread portion 5a. A needle or pin diameter d of the temperature control elements 19 formed needle or pin-like amounts to between 0.5 mm and 3 mm each. A needle or pin length l of the temperature control elements 19 formed needle or pin-like amounts to between 5 mm and 50 mm each. As is additionally evident from FIG. 3, the temperature control elements 19 formed needle or pin-like each have an end portion 24 facing away from the first thread portion 5a, which tapers conically away from the first thread portion 5a. This facilitates piercing the temperature control elements 19 through the duct wall 13 of the cooling duct as part of the assembly of the device 16. However, the end portion can also be flat, the temperature control element in this version is cylindrical.

Figure 4:
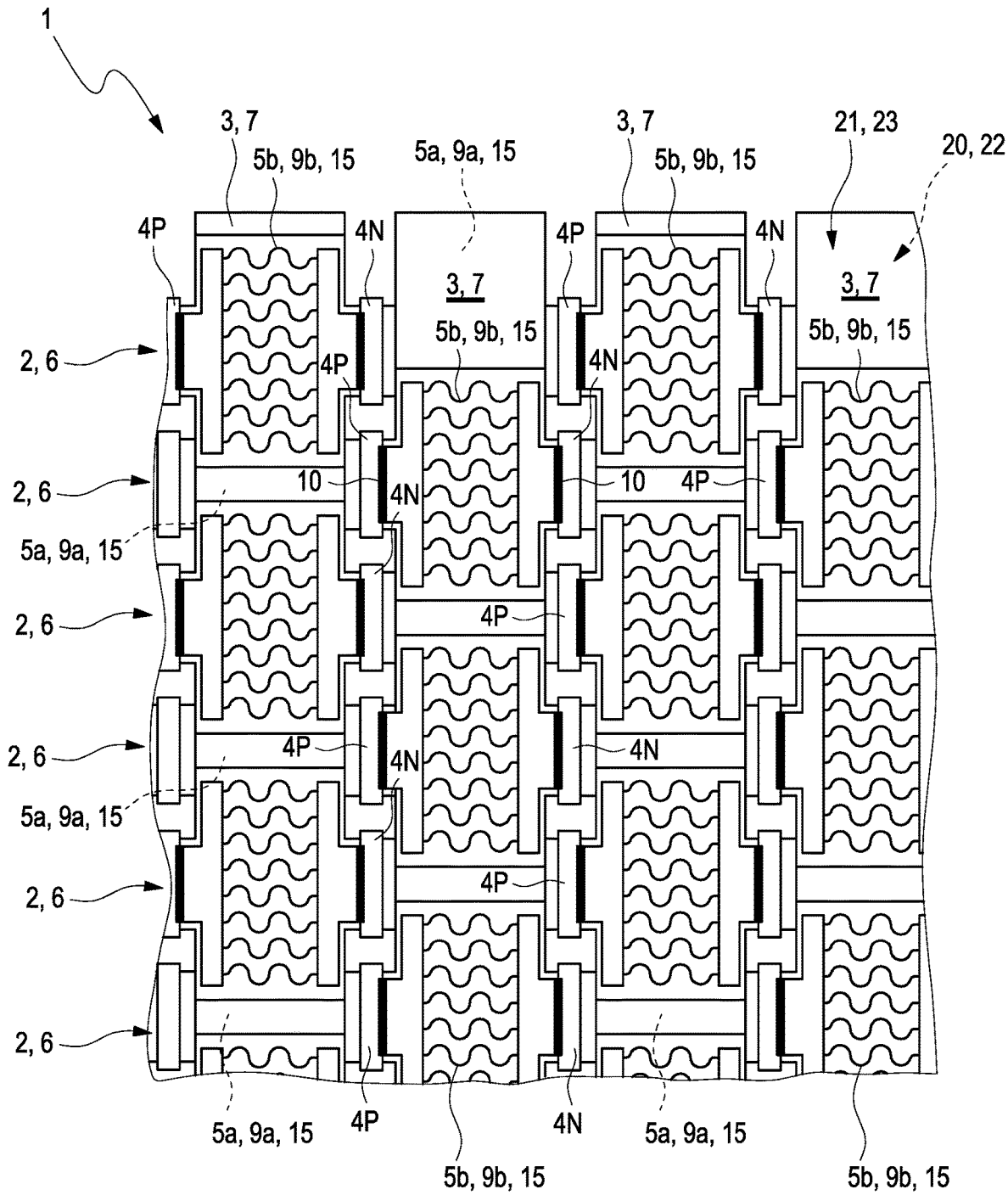

FIG. 4 shows a further version of FIG. 1 in a plan view of a top side 23 of the fabric 1 located opposite the underside 22 along a viewing direction B2, which extends anti-parallel to the viewing direction B1 of FIG. 1. The example of FIG. 4 differs from that of FIG. 1 in that the second thread portions 5b of the first threads 2 in the plan view of the top side 23 of the fabric 1 substantially cover this top side 23 completely. In an analogous manner, the first thread portions 5a in this version can, in a plan view of the underside 22 of the fabric 1 (not shown in FIG. 4), substantially cover this underside 22 completely. "Substantially" in this case can mean in particular that merely the doped conductor track portions and intermediate spaces between adjacent warp or weft threads are not being covered. By means of the measures explained above, the efficiency of the thermoelectric fabric 1 relative to the example of FIG. 1 can be further increased.

The invention claimed is:

1. A thermoelectric fabric comprising:
a plurality of first threads, which are alternately formed by p-doped and n-doped thread portions and electrically conductive first thread portions and second thread portions arranged in between, wherein the first thread portions form a hot side of the fabric and the second thread portions form a cold side of the fabric; and
a plurality of second threads;
wherein the first threads form one of warp threads or weft threads of the fabric, and the second threads form the other of the warp threads or weft threads of the fabric; and
wherein, on at least one of the first thread portions of at least one of the plurality of first threads, a temperature control structure with at least one temperature control element for cooling the hot side is present.

2. The thermoelectric fabric according to claim 1, wherein the at least one temperature control element includes at least two temperature control elements.

3. The thermoelectric fabric according to claim 1, the at least one temperature control element is formed pin-like, needle-like, or blade-like.

4. The thermoelectric fabric according to claim 1, wherein at least one of:
diameter of the at least one temperature control element is between 0.5 mm and 3 mm;
length of the at least one temperature control element is between 5 mm and 50 mm; and
the at least one temperature control element includes an end portion facing away from the respective first thread portion, the end portion tapering away from the respective first thread portion.

5. The thermoelectric fabric according to claim 1, wherein the at least one temperature control element is connected to the respective first thread portion in at least one of a firmly bonded manner and a positively locked manner.

6. The thermoelectric fabric according to claim 1, wherein the at least one temperature control element projects from the respective first thread portion at an angle.

7. The thermoelectric fabric according to claim 1, wherein at least one of:
the first thread portions are formed by areal, flexible conductor track portions; and
the second thread portions are formed by areal, flexible conductor track portions.

8. The thermoelectric fabric according to claim 7, wherein the conductor track portions include a substrate material having one of polyurethane or polyimide.

9. The thermoelectric fabric according to claim 7, wherein a conductor track material of the conductor track portions is one of copper or aluminium.

10. The thermoelectric fabric according to claim 7, wherein the conductor track portions are laminated.

11. The thermoelectric fabric according to claim 1, at least one of:
the p-doped thread portions are soft-soldered to the at least one of: (i) the first thread portions, and (ii) the second thread portions; and
the n-doped thread portions are soft-soldered to the at least one of: (i) the first thread portions, and (ii) the second thread portions.

12. The thermoelectric fabric according to claim 1, wherein at least one of:
first thread portions, in a plan view of an underside of the fabric, substantially completely cover the underside; and
the second thread portions, in a plan view of a top side of the fabric, substantially completely cover the top side.

13. The thermoelectric fabric according to claim 1, wherein the second threads are formed by substrate ribs.

14. A thermoelectric device for a vehicle seat, comprising:
a coolant path for a coolant to flow through; and
a thermoelectric fabric having:
a plurality of first threads, which are alternately formed by p-doped and n-doped thread portions and electrically conductive first thread portions and second thread portions arranged in between, the first thread portions forming a hot side of the fabric and the second thread portions forming a cold side of the fabric; and
a plurality of second threads;
wherein the first threads form one of warp threads or weft threads of the fabric, and the second threads form the other of the warp threads or weft threads of the fabric;

wherein, on at least one of the first thread portions of at least one of the plurality of first threads, a temperature control structure with at least one temperature control element for cooling the hot side is present; and wherein the at least one temperature control elements projects into the coolant path.

15. The thermoelectric device according to claim 14, wherein:

the coolant path includes a cooling duct with a duct wall on which the thermoelectric fabric is arranged; and in the duct wall, openings are formed, the at least one temperature control elements engaging through a corresponding one of the openings.

16. A vehicle seat for a motor vehicle, comprising:

at least one of a seat body and a seat rest having a thermoelectric device including:

a coolant path for a coolant to flow through; and a thermoelectric fabric having:

a plurality of first threads, which are alternately formed by p-doped and n-doped thread portions and electrically conductive first thread portions and second thread portions arranged in between, the first thread portions forming a hot side of the fabric and the second thread portions forming a cold side of the fabric; and a plurality of second threads;

wherein the first threads form one of warp threads or weft threads of the fabric, and the second threads form the other of the warp threads or weft threads of the fabric;

wherein, on at least one of the first thread portions of at least one of the plurality of first threads, a temperature control structure with at least one temperature control element for cooling the hot side is present; and wherein the at least one temperature control element projects into the coolant path.

17. The vehicle seat according to claim 16, wherein the thermoelectric device is arranged or received in a recess formed in the seat body.

18. A motor vehicle comprising at least one vehicle seat having at least one of a seat body and a seat rest that has a thermoelectric device including:

a coolant path for a coolant to flow through; and a thermoelectric fabric having:

a plurality of first threads, which are alternately formed by p-doped and n-doped thread portions and electrically conductive first thread portions and second thread portions arranged in between, the first thread portions forming a hot side of the fabric and the second thread portions forming a cold side of the fabric; and a plurality of second threads;

wherein the first threads form one of warp threads or weft threads of the fabric, and the second threads form the other of the warp threads or weft threads of the fabric;

wherein, on at least one of the first thread portions of at least one of the plurality of first threads, a temperature control structure with at least one temperature control element for cooling the hot side is present and wherein the at least one temperature control element projects into the coolant path.

19. The thermoelectric fabric according to claim 2, wherein the at least one temperature control element includes between three and twenty temperature control elements.

20. The thermoelectric fabric according to claim 13, wherein the substrate ribs are of a closed-pore silicone foam.

* * * * *